US010992220B2

United States Patent
Nukui

(10) Patent No.: US 10,992,220 B2
(45) Date of Patent: Apr. 27, 2021

(54) POWER SUPPLY CIRCUIT FOR FIBER LASER OSCILLATOR USE

(71) Applicant: FANUC CORPORATION, Yamanashi (JP)

(72) Inventor: Tooru Nukui, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/272,445

(22) Filed: Feb. 11, 2019

(65) Prior Publication Data
US 2019/0260288 A1 Aug. 22, 2019

(30) Foreign Application Priority Data
Feb. 20, 2018 (JP) .............................. JP2018-027923

(51) Int. Cl.
*H02M 1/42* (2007.01)
*H02M 7/46* (2006.01)

(52) U.S. Cl.
CPC ........ *H02M 1/4225* (2013.01); *H02M 1/4208* (2013.01); *H02M 7/46* (2013.01)

(58) Field of Classification Search
CPC . H02M 7/2176; H02M 1/4216; H02M 1/4225
See application file for complete search history.

(56) References Cited

U.S. PATENT DOCUMENTS

| 6,526,200 | B1 * | 2/2003 | Davie | G02B 6/0006 |
| | | | | 362/559 |
| 6,718,792 | B1 * | 4/2004 | Sarkisian | F25B 30/04 |
| | | | | 62/324.2 |
| 2009/0024929 | A1 * | 1/2009 | Gloege | G06F 1/26 |
| | | | | 715/740 |
| 2013/0193119 | A1 * | 8/2013 | Broger | B23K 26/1464 |
| | | | | 219/121.6 |

(Continued)

FOREIGN PATENT DOCUMENTS

| JP | H11163444 A | 6/1999 |
| JP | 2013-504285 A | 2/2013 |

(Continued)

OTHER PUBLICATIONS

An Office Action mailed by the Japanese Patent Office dated Apr. 7, 2020, which corresponds to Japanese Patent Application No. 2018-027923 and is related to U.S. Appl. No. 16/272,445; with English language translation.

(Continued)

*Primary Examiner* — Peter M Novak
(74) *Attorney, Agent, or Firm* — Studebaker & Brackett PC

(57) ABSTRACT

To provide a power supply circuit for fiber laser oscillator use capable of reducing the size of a fiber laser oscillator. A power supply circuit for fiber laser oscillator use comprises: a rectifier circuit unit capable of receiving input of a voltage having a particular value; and a power supply unit to which the rectifier circuit unit is connected. The rectifier circuit unit (Continued)

is one rectifier circuit unit selectable from multiple rectifier circuit units capable of receiving inputs of voltages having different values. Each of the rectifier circuit units includes a power factor correction circuit for adjusting a power factor at 1.

8 Claims, 2 Drawing Sheets

(56) References Cited

U.S. PATENT DOCUMENTS

| | | | | |
|---|---|---|---|---|
| 2014/0103804 A1* | 4/2014 | Zhdanau | ............ | H05B 33/0803 |
| | | | | 315/85 |
| 2015/0103404 A1* | 4/2015 | Rudy | ................... | G02B 27/017 |
| | | | | 359/567 |
| 2015/0311723 A1* | 10/2015 | Raedy | ................... | H02M 3/337 |
| | | | | 307/104 |
| 2018/0027622 A1* | 1/2018 | Doi | ................... | H05B 33/0845 |
| | | | | 315/307 |
| 2018/0366915 A1* | 12/2018 | Zilkie | ................ | G02B 6/29343 |
| 2019/0173253 A1* | 6/2019 | Honda | .................. | H01S 3/1312 |

FOREIGN PATENT DOCUMENTS

| | | |
|---|---|---|
| JP | 2016-152686 A | 8/2016 |
| JP | 2017-103413 A | 6/2017 |
| JP | 2018-503966 A | 2/2018 |

OTHER PUBLICATIONS

An Office Action mailed by the Japanese Patent Office dated Jan. 8, 2020, which corresponds to Japanese Patent Application No. 2018-027923 and is related to U.S. Appl. No. 16/272,445.

An Office Action; "Notice of Reasons for Refusal," mailed by the Japanese Patent Office dated Jul. 14, 2020, which corresponds to Japanese Patent Application No. 2018-027923 and is related to U.S. Appl. No. 16/272,445; with English language translation.

* cited by examiner

POWER SUPPLY CIRCUIT FOR FIBER LASER OSCILLATOR USE

This application is based on and claims the benefit of priority from Japanese Patent Application No. 2018-027923, filed on 20 Feb. 2018, the content of which is incorporated herein by reference.

BACKGROUND OF THE INVENTION

Field of the Invention

The present invention relates to a power supply circuit for fiber laser oscillator use.

Related Art

Conventionally, a switching regulator including a rectifier circuit, a switching circuit, a smoothing circuit, and a control circuit has publicly been known as a power supply circuit provided to a fiber laser oscillator (see patent document 1, for example).

Patent Document 1: Japanese Unexamined Patent Application, Publication No. 2017-103413

SUMMARY OF THE INVENTION

In this switching regulator, losses in the rectifier circuit cause a reduction in the power factor of a power supply, which can result in an increase in the size of the power supply to accommodate an electrical part, such as a breaker necessary for a fiber laser oscillator. Additionally, a power supply voltage varies between different countries in the world: AC 200 V in Japan and from AC 380 to 480 V in America and European countries. Further, there are also different wire feed systems including star connection and delta connection. Thus, power-supply design changes in response to voltage in terms of the wire diameter of a cable, an insulation distance, or the pressure resistance of a part, for example. In response to this issue, a voltage conversion transformer is used.

The voltage conversion transformer is provided in the laser oscillator, or provided separately from the laser oscillator. In either case, the capacity of the voltage conversion transformer is increased if the fiber laser oscillator is to produce high output. The transformer requires a large amount of space and problematically increases the size of the fiber laser oscillator.

The present invention is intended to provide a power supply circuit for a fiber laser oscillator and reduce the size of a fiber laser oscillator.

(1) A power supply circuit for fiber laser oscillator use according to the present invention (power supply circuit 1 for fiber laser oscillator use described later, for example) comprises: a rectifier circuit unit (rectifier circuit unit 2 described later, for example) capable of receiving input of a voltage having a particular value; and a power supply unit (power supply unit 3 described later, for example) to which the rectifier circuit unit is connected. The rectifier circuit unit is one rectifier circuit unit selectable from multiple rectifier circuit units capable of receiving inputs of voltages having different values.

(2) In the power supply circuit for fiber laser oscillator use described in (1), each of the rectifier circuit units may include a power factor correction circuit (power factor correction circuit 23 described later, for example) for adjusting a power factor at 1.

According to the present invention, a power supply circuit for fiber laser oscillator use capable of reducing the size of a fiber laser oscillator can be provided.

DETAILED DESCRIPTION OF THE INVENTION

Figure 1:
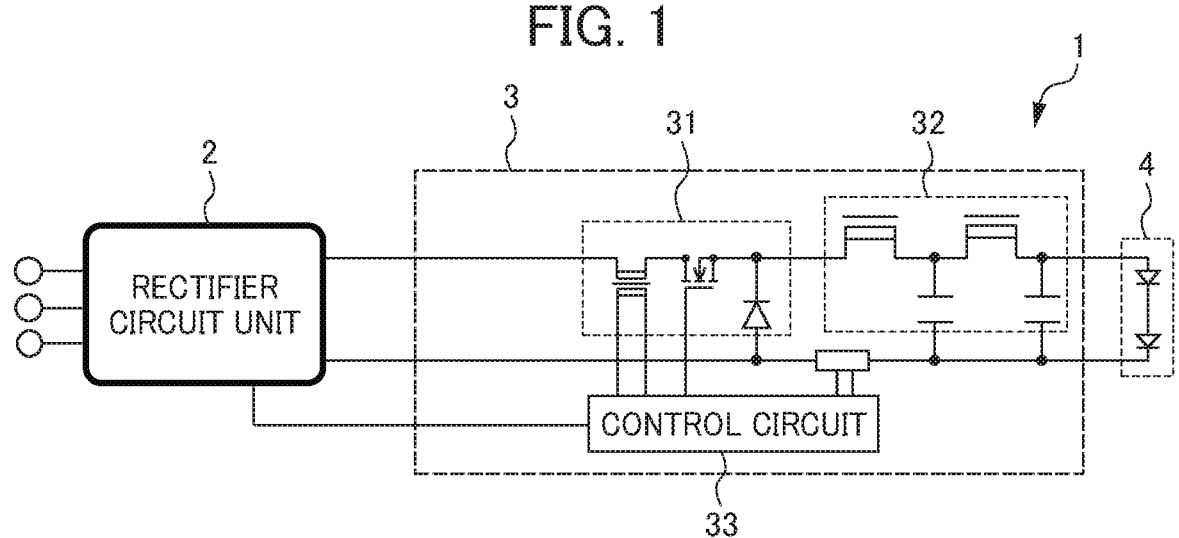
FIG. 1 is a schematic view showing a power supply circuit for fiber laser oscillator use according to an embodiment of the present invention.

An embodiment of the present invention will be described in detail below by referring to the drawings.

Figure 2:
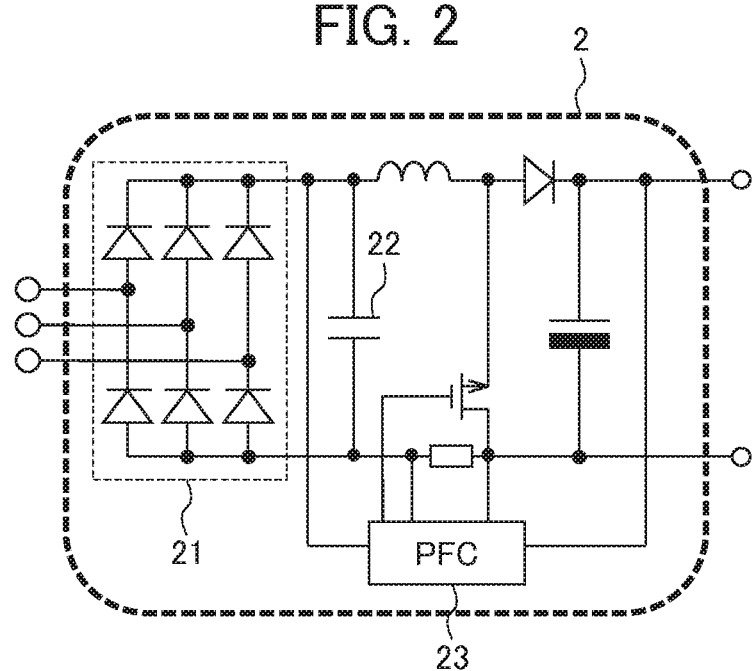
FIG. 2 is a schematic view showing a rectifier circuit unit in the power supply circuit for fiber laser oscillator use according to the embodiment of the present invention.

FIG. 1 is a schematic view showing a power supply circuit 1 for fiber laser oscillator use according to the embodiment of the present invention. FIG. 2 is a schematic view showing a rectifier circuit unit 2 in the power supply circuit 1 for fiber laser oscillator use according to the embodiment of the present invention.

As shown in FIG. 1, the power supply circuit 1 for fiber laser oscillator use is installed on a fiber laser oscillator to which a machining head is connected and to be used as a laser machine. More specifically, the power supply circuit 1 for fiber laser oscillator use includes the rectifier circuit unit 2, a power supply unit 3, and a laser diode module 4.

As shown in FIG. 2, the rectifier circuit unit 2 is capable of receiving input of an AC voltage having a particular value. The rectifier circuit unit 2 increases or decreases an input voltage inside the rectifier circuit unit 2, and outputs a DC voltage. For example, the rectifier circuit unit 2 includes six diodes 21, a capacitive element 22, a power factor correction circuit 23, etc. The power factor correction circuit 23 is a circuit for adjusting a power factor at 1, namely, for approximating a power factor to 1. The structures in the rectifier circuit unit 2 except the power factor correction circuit 23 are well known as general structures in a rectifier circuit. Thus, these structures will not be described in detail.

Description continues by referring back to FIG. 1. The rectifier circuit unit 2 is connected to the power supply unit 3. The rectifier circuit unit 2 is one rectifier circuit unit 2 selectable from multiple rectifier circuit units 2 capable of receiving inputs of voltages having different values such as a rectifier circuit unit 2 for receiving input of AC 200 V, and a rectifier circuit unit 2 for receiving input of AC 400 V, for example. More specifically, the power supply unit 3 includes a switching circuit 31, a smoothing circuit 32, and a control circuit 33, etc.

The switching circuit 31 includes a switching transistor and a diode. In the switching circuit 31, the switching transistor is turned on and off in response to a control signal from the control circuit 33 to generate a charging current in cooperation with the diode.

The smoothing circuit 32 includes an inductance element and a capacitive element. The smoothing circuit 32 generates a DC voltage across the capacitive element from the charging current, and outputs the generated DC voltage to the laser diode module 4.

Figure 3:
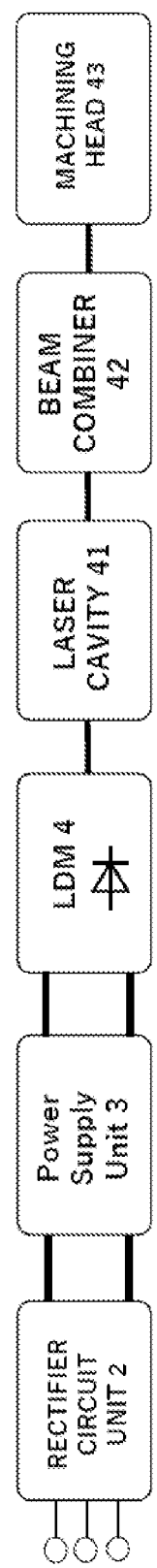
FIG. 3 is a schematic view showing the power supply circuit of FIG. 1 connected to laser cavities, a beam combiner and a laser machining head.

The power supply circuit 1 for fiber laser oscillator use according to the embodiment includes multiple power supply circuits 1 arranged in parallel in a fiber laser oscillator, for example. As shown, for example, in FIG. 3, power supply circuits 1 are connected to corresponding laser cavities 41, and lasers oscillated from the corresponding laser cavities 41 are combined by a beam combiner 42, and then output from a laser machining head 43.

According to the power supply circuit 1 for fiber laser oscillator use of the embodiment having the foregoing configuration, the rectifier circuit unit 2 is provided as a unit separate from the power supply unit 3. This makes it possible to use the rectifier circuit unit 2 to be connected to the power supply circuit 1 properly in a manner that depends on power supply situations in every country. This achieves flexible coping with power supply situations in every country while achieving space saving for not using a voltage conversion transformer. Further, the rectifier circuit unit 2 can be water cooled. This makes the size of the rectifier circuit unit 2 smaller than that of a voltage conversion transformer, and this eventually results in size reduction of a fiber laser oscillator.

Providing the rectifier circuit unit 2 as a unit separate from the power supply unit 3 does not affect the performance of controlling the laser diode module 4. Using only a general rectifier circuit reduces a power factor, so that the capacity of an electrical part such as a power input unit or a power switchboard is increased. By contrast, according to the embodiment, the provision of the power factor correction circuit 23 in the rectifier circuit unit 2 achieves further size reduction of the fiber laser oscillator.

For designing products to be used in Japan, for example, the rectifier circuit unit 2 capable of receiving input of a voltage of AC 200 V is selected. The selected rectifier circuit unit 2 is to increase an input voltage inside the rectifier circuit unit 2, and output DC 380 V. Then, the selected rectifier circuit unit 2 is connected to the power supply unit 3 capable of receiving input of a voltage of DC 380 V. For designing products to be used in America and European countries, the rectifier circuit unit 2 capable of receiving input of a voltage having a particular value from AC 380 to AC 480 V is selected. The selected rectifier circuit unit 2 is to decrease an input voltage inside the rectifier circuit unit 2, and output DC 380 V. Then, the selected rectifier circuit unit 2 is connected to the power supply unit 3 capable of receiving input of a voltage of DC 380 V. In this way, design allowing input of a voltage of DC 380 V can be used in common for the power supply unit 3. This makes it possible to cope with products in every country in the world only by changing the rectifier circuit unit 2.

The present invention should not be limited to the embodiment described above. The effects described in the embodiment are merely a list of the most preferable effects resulting from the present invention. Effects achieved by the present invention should not be limited to those described in the embodiment.

In the foregoing embodiment, for example, the rectifier circuit unit such as that shown in FIG. 2 is used as the rectifier circuit unit 2. However, this is not the only case. Various types of rectifier circuit units connectable to the power supply unit 3 are available.

EXPLANATION OF REFERENCE NUMERALS

1 Power supply circuit
2 Rectifier circuit unit
21 Diode
22 Capacitive element
23 Power factor correction circuit
3 Power supply unit
31 Switching circuit
32 Smoothing circuit
33 Control circuit
4 Laser diode module

What is claimed is:

1. A power supply circuit for fiber laser oscillator use, comprising:
    a power supply unit physically containing a plurality of power supply circuits that are connected to a plurality of laser cavities of a laser diode module, the laser diode module being configured to provide a plurality of laser lights to a beam combiner that combines the plurality of laser lights into combined laser light and provides the combined laser light to a laser machining head; and
    a rectifier circuit unit, separate and distinct from the power supply unit, water cooled, and physically containing rectifier circuitry configured to receive an input voltage having a particular value and provide an output voltage to the power supply unit based on the input voltage, such that the power supply unit is configured to power the laser diode module via the power supply circuits, based on the output voltage received from the rectifier circuit unit, to cause the laser diode module to generate the laser lights.

2. The power supply circuit for fiber laser oscillator use according to claim 1, wherein the rectifier circuitry includes a power factor correction circuit for adjusting a power factor at 1.

3. The power supply circuit for fiber laser oscillator use according to claim 2, wherein
    the rectifier circuitry includes a plurality of diodes, and
    the power factor correction circuit is connected between the plurality of diodes and an output terminal of the rectifier circuit unit.

4. The power supply circuit for fiber laser oscillator use according to claim 1, wherein
    the rectifier circuit unit is connected to the power supply unit by connections that are connected to external terminals of the rectifier circuit unit.

5. The power supply circuit for fiber laser oscillator use according to claim 1, wherein
    the rectifier circuitry includes a plurality of diodes and a capacitive element connected in parallel with the plurality of diodes.

6. The power supply circuit for fiber laser oscillator use according to claim 5, wherein
    the rectifier circuitry further includes a power factor correction circuit, connected between the plurality of diodes and an output terminal of the rectifier circuit unit, for adjusting a power factor at 1.

7. The power supply circuit for fiber laser oscillator use according to claim 1, wherein
    the power supply circuits include a switching circuit, and a control circuit configured to control switching of the switching circuit.

8. The power supply circuit for fiber laser oscillator use according to claim 7, wherein the control circuit is connected to the rectifier circuit unit.

* * * * *